United States Patent [19]

Girard et al.

[11] 3,974,304
[45] Aug. 10, 1976

[54] METHOD OF MAKING A VOLTAGE RESPONSIVE SWITCH

[75] Inventors: Roland T. Girard, Scotia; George A. Rice, Schenectady; Arthur N. DeTommasi, Newtonville, all of N.Y.

[73] Assignee: General Electric Company, Schenectady, N.Y.

[22] Filed: Mar. 3, 1975

[21] Appl. No.: 554,725

[52] U.S. Cl. ............................. 427/58; 427/101; 427/102; 427/123
[51] Int. Cl.² ...................... B05D 7/00; B05D 5/12
[58] Field of Search ............ 427/58, 101, 102, 216, 427/399, 123; 252/512, 518

[56] References Cited
UNITED STATES PATENTS

| | | |
|---|---|---|
| 2,720,573 | 10/1955 | Lundquist .......................... 252/518 |
| 2,993,815 | 7/1961 | Treptow ............................. 252/512 |
| 3,647,532 | 3/1972 | Friedman ........................... 252/512 |
| 3,776,769 | 12/1973 | Buck .................................. 252/518 |
| 3,787,965 | 1/1974 | Cocca ................................ 427/102 |

Primary Examiner—Michael F. Esposito
Attorney, Agent, or Firm—John F. McDevitt; Lawrence R. Kempton; Frank L. Neuhauser

[57] ABSTRACT

A method of making a voltage sensitive switch characterized by an irreversible change in resistance from a high resistance state greater than one megohm to a low resistance state less than one thousand ohms is described as comprising mixing substantially pure grade copper powder with copper oxide powder, adding a binder to the mixture and applying the resulting mixture to a pair of spaced electrodes.

6 Claims, 4 Drawing Figures

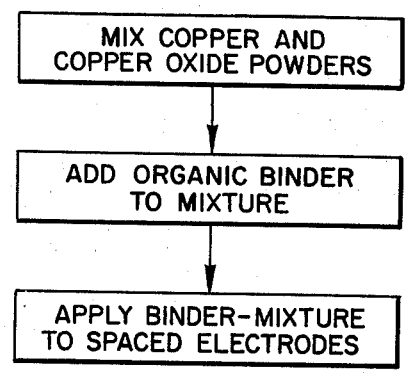
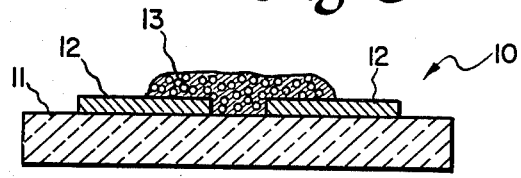
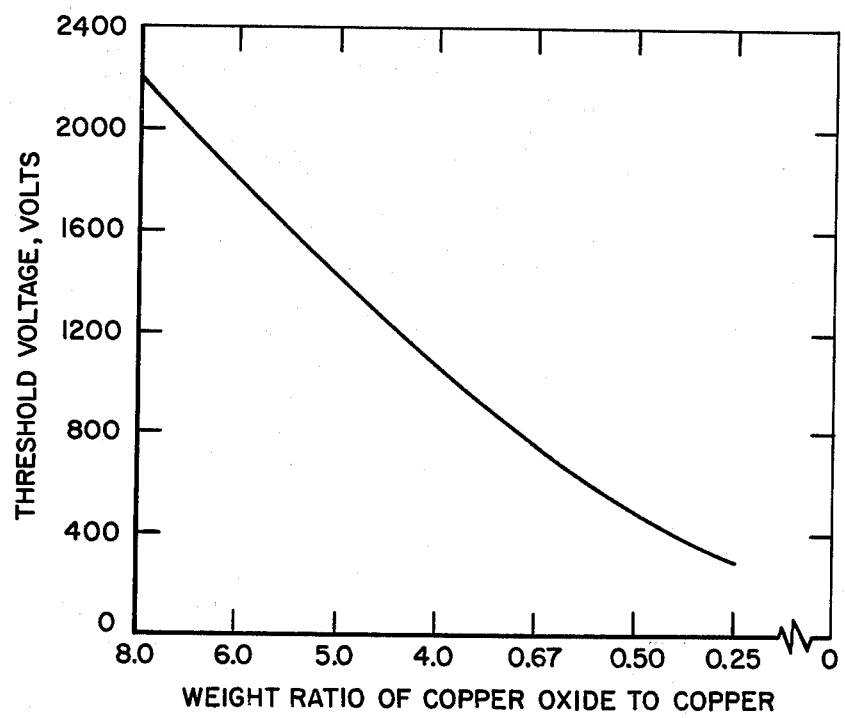
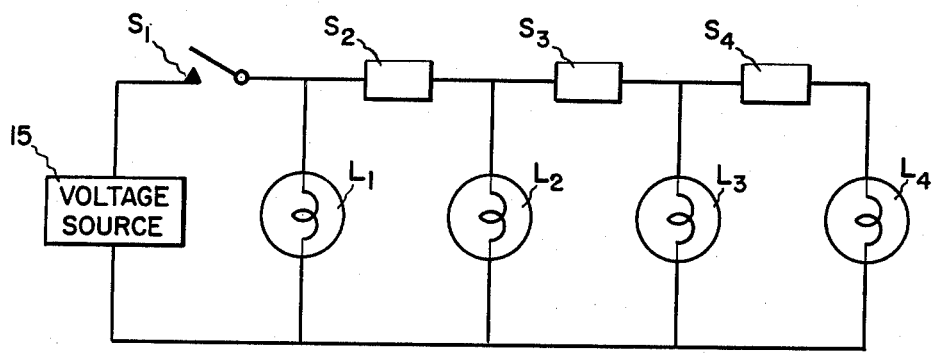

METHOD OF MAKING A VOLTAGE RESPONSIVE SWITCH

The present invention relates to voltage responsive switches and more particularly to methods of making voltage responsive switches characterized by an irreversible resistance change from a high resistance to a low resistance upon the application of a voltage greater than the threshold voltage of the switch.

Voltage responsive switches are utilized in a wide variety of electrical and electronic devices. For example, such switches are utilized in providing voltage protection to delicate instruments, such as meters, or in sequentially fired flash lamps. In this latter application, it is imperative that the voltage responsive switch exhibit an irreversible change in resistance, preferably from a high resistance state to a low resistance state, to insure reliable sequential flash operation. Since the use of sequential flash lamps occurs in uncontrollable conditions of high humidity, high temperature, and frequently in the presence of high electromagnetic radiation fields, it is imperative that such switches do not exhibit a reversible resistance change. For example, Sliva et al. describe in the Journal of Noncrystalline Solids, 2(1970) 316–333, the bistable switching and memory characteristics of a variety of amorphous, organic, and polycrystalline materials useful in bistable switching devices. While such devices may be quite useful for their intended applications, their use in a sequentially operated flash lamp device is unsatisfactory because the bistable resistance characteristic can be altered by the presence of stray electromagnetic fields, for example.

Accordingly, it is an object of this invention to provide a method and apparatus for making an irreversible voltage sensitive switch characterized by a high resistance state of greater than a megohm and a low resistance state of less than approximately 100 ohms. Briefly, in accord with one embodiment of our invention, a method of making an irreversible voltage sensitive switch comprises the steps of mixing substantially pure grade copper powder of approximately 99.99% purity with copper oxide ($Cu_2O$) powder, adding an organic binder to the copper-copper oxide mixture and applying the resulting mixture or slurry to a pair of spaced electrodes. As will be described more fully below, the ratios of the copper-copper oxide powders and the spacing of the electrodes determines the threshold voltage at which the irreversible voltage sensitive switch changes from a high resistance to a low resistance.

Further objects and advantages of our invention, along with a more complete description thereof, are provided in the following detailed description taken in conjunction with the accompanying drawings in which:

FIG. 1 is a flow chart of the steps in the method of making the present invention;

FIG. 2 illustrates the change in threshold voltage as a function of the ratio of copper oxide to copper;

FIG. 3 illustrates a voltage responsive switch constructed in accord with the present invention; and FIG. 4 illustrates a schematic diagram of the use of voltage responsive switches in sequentially operated photoflash devices.

FIG. 1 illustrates a flow chart of a preferred method of making a voltage responsive switch characterized by an irreversible resistance change upon the application of a voltage greater than the threshold voltage of the switch. The method includes mixing substantially pure grade copper powder of approximately 99.99% purity with copper oxide powder. The pure copper and copper oxide powders, preferably having particle sizes of between 1 and 30 microns, are mixed together in proportions hereinafter described, with an organic binder, the amount being sufficient to protect the pure copper powder from oxidation. The resulting mixture of copper, copper oxide and binder are then applied in the form of a slurry to a pair of spaced electrodes supported on a suitable nonconducting substrate. Suitable binders useful in practicing the invention are preferably of the organic type such as epoxy resins, anerobic adhesives and nitrocellulose glue. These organic binders, when mixed with the copper-copper oxide powders in ratios of one part binder to from two to five parts copper-copper oxide, provide adequate protection for the pure copper from oxidation and insure adequate adhesion to the spaced electrodes.

Those skilled in the art can readily appreciate that in the use of organic binders, it is frequently desirable to employ suitable thinners to provide a more workable slurry of materials. Obviously, these thinners are advantageously volatile and, after having served their function, may be removed by moderate heating.

FIG. 2 illustrates a particularly significant feature of the present invention, the variation in threshold voltage of the voltage sensitive switch as a function of the weight ratio of copper oxide to copper for a fixed spacing between a pair of electrodes. More specifically, as the percentage of copper oxide increases, the threshold voltage also increases. However, those skilled in the art can also appreciate that in addition to altering the ratio of copper oxide to copper to effect threshold variations, the gap between the spaced electrodes can also be varied to effect substantially the same result.

FIG. 3 illustrates, by way of example, a typical voltage responsive switch 10 comprising an insulating substrate or support member 11 with two spaced electrodes 12 supported thereon and the copper-copper oxide and binder mixture 13 adhering to the spaced electrodes 12. In practicing the invention, the spacing between the electrodes is advantageously between approximately 25 and 200 mils and preferably between 50 and 100 mils.

A particularly useful application of the irreversible voltage switch of our invention is illustrated in FIG. 4 wherein a plurality of flash lamps $L_1$, $L_2$, $L_3$ and $L_4$ are sequentially connected to a voltage source 15 through a plurality of switches $S_1$, $S_2$, $S_3$, $S_4$. The switch $S_1$ is a mechanically actuated momentary switch, preferably one synchronized with the shutter opening of a camera, for example. Alternately, the voltage source 15 could be a piezoelectric generator, which produces an output voltage each time the piezoelectric element is struck mechanically, thereby obviating the need for switch $S_1$.

Operationally, upon closure of switch 1 and the presence of a voltage from the source 15, the flash lamp $L_1$ is fired. Since switch $S_2$, constructed in accord with the instant invention, is in its high resistance state, substantially all current is shunted through the flash lamp $L_1$ and none through $L_2$. Upon subsequent closure of switch $S_1$, however, the flash lamp $L_1$ now appears as an open circuit and the source voltage 15 is applied directly to the series combination of switch $S_2$ and photolamp $L_2$. As soon as the threshold voltage of switch $S_2$ is exceeded, the impedance or resistance of the switch $S_2$ changes from a high value, i.e., in excess of several megohms to less than 100 ohms, and current from the source 15 flows through the switch $S_2$ and lamp $L_2$ thereby causing the lamp $L_2$ to fire. With each successive closure of switch $S_1$, lamps $L_3$ and $L_4$ fire in a similar manner.

One of the particularly significant features of the present invention is the irreversible resistance change of the switches described in accord with this invention. This characteristic feature is particularly significant in the operation of sequentially fired photolamps where an extremely high degree of reliability is required for sequential firing of the lamps. Since the ambient conditions under which sequentially operated photoflash units are uncontrollable, it is essential that the switching elements exhibit an irreversible change in resistance.

The following specific examples are given by way of illustration of the practice of the instant invention and not limitation.

EXAMPLE 1

Two grams of five micron-size copper oxide are mixed with three grams of one micron pure copper. A slurry including this mixture along with 1.5 grams of epoxy solution and 0.5 grams of butyl Carbitol acetate are stirred together until a consistent mixture is achieved. The resulting slurry is then applied to two electrodes spaced approximately 100 mils apart. After the epoxy has solidified, the resulting switch is found to exhibit a high resistance approximately 10 megohms. Upon application of a voltage of approximately 800 volts, the resistance of the switch changes to approximately 500 ohms.

EXAMPLE 2

The mixture of Example 1 is altered so that four grams of copper and 1 gram of copper oxide are combined in an epoxy slurry and the slurry applied to a pair of electrodes spaced approximately 100 mils apart. After the epoxy has hardened, the switch exhibits a high resistance of approximately 10 megohms. Upon application of a voltage of approximately 200 volts, the resistance of the switch is approximately 500 ohms.

EXAMPLE 3

The mixture of Example 1 is altered so that approximately six grams of copper oxide and only one gram of pure copper are combined in the mixture and the resultant slurry is applied to a pair of electrodes spaced approximately 100 mils apart. The resistance of the switch is approximately 10 megohms and upon application of a voltage of 1800 volts, the switch exhibits a resistance of approximately 500 ohms.

In view of the foregoing description and the specific examples described above, it is apparent that a highly reliable and low cost switch having an irreversible change in resistance upon the application of a voltage in excess of the threshold voltage is disclosed.

Those skilled in the art can readily appreciate that various modifications may be made within the spirit and scope of the present invention. For example, whereas the present invention is described for use in a photoflash unit, obviously other voltage responsive switch applications also exist, such as voltage protection for meter circuits, for example. Further, it should be appreciated that the copper-copper oxide binder mixture can be applied by spraying, painting or screen printing, if desired. Accordingly the appended claims are intended to cover all such modifications and variations as fall within the true spirit and scope of this invention.

What is claimed as new is:

1. A method of making a voltage sensitive switch characterized by an irreversible change in resistance from a first high resistance state of greater than approximately 1 megohm to a second low resistance state of less than approximately 1000 ohms, said method consisting essentially of the steps of:
    mixing substantially pure grade copper powder of approximately 99.99% purity with copper oxide powder in weight ratios of copper oxide to copper in the range of approximately eight parts copper oxide and one part copper to one part copper oxide and four parts copper, said powders having particle sizes of between approximately 1 and 30 microns;
    adding an organic binder to said copper-copper oxide mixture; and
    applying the resulting mixture to a pair of spaced electrodes.

2. The method of claim 1 wherein said binder is an organic resin material.

3. The method of claim 2 wherein said binder is an epoxy resin.

4. The method of claim 1 wherein said binder is present in an amount of approximately one part binder to five parts copper-copper oxide powder by weight.

5. The method of claim 1 wherein said powders have particle sizes of between approximately 1 and 10 microns.

6. The method of claim 5 wherein said electrodes are spaced approximately 100 mils apart.

* * * * *